US006352906B1

(12) United States Patent
Leobandung

(10) Patent No.: US 6,352,906 B1
(45) Date of Patent: Mar. 5, 2002

(54) NITRIDIZATION OF STI SIDEWALLS

(75) Inventor: Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/628,864

(22) Filed: Jul. 28, 2000

(51) Int. Cl.[7] ................................ H01L 21/76
(52) U.S. Cl. .............. 438/435; 438/400; 438/424; 438/437; 438/149
(58) Field of Search ................ 438/400, 424, 438/435, 437, 149

(56) References Cited

U.S. PATENT DOCUMENTS 5,447,488 A * 9/1995 Fahey et al.
5,811,347 A * 9/1998 Gardner et al. ............. 438/435
5,985,735 A * 11/1999 Moon et al. ................ 438/435
6,225,659 B1 * 5/2001 Liu ........................... 257/314

* cited by examiner

*Primary Examiner*—Long Pham
(74) *Attorney, Agent, or Firm*—Eric W. Petraske

(57) ABSTRACT

In an SOI integrated circuit employing shallow trench isolation, the walls of the transistor active area have a nitridized oxide layer grown on them, thereby preventing the diffusion of dopants out of the transistor body and preventing a shift in threshold voltage.

2 Claims, 3 Drawing Sheets

NITRIDIZATION OF STI SIDEWALLS

FIELD OF THE INVENTION

The field of the invention is integrated circuit fabrication, in particular fabrication on SOI wafers.

BACKGROUND OF THE INVENTION

Shallow trench isolation (STI) has become standard in submicron integrated circuit processing, including silicon on insulator (SOI) processing, because of its size benefits.

A problem in small size devices, especially narrow devices (less than about 500 nm) is that of maintaining a stable threshold voltage.

SUMMARY OF THE INVENTION

The invention relates to an SOI integrated circuit employing shallow trench isolation, in which the walls of the transistor active area have a nitridized oxide layer grown on them, thereby preventing the diffusion of dopants out of the transistor body.

DESCRIPTION OF THE PREFERRED EMBODIMENT

It has been found that a cause of instability of narrow submicron transistors is that $V_t$ can be affected by various causes that cause it to be off spec.

One such cause has been found to be the diffusion of a dopant, such as Boron, out of the transistor body and into adjacent oxide, either into the oxide used to fill an STI trench or into the buried oxide (BOX) below the silicon device layer that contains the transistor bodies.

Figure 1:
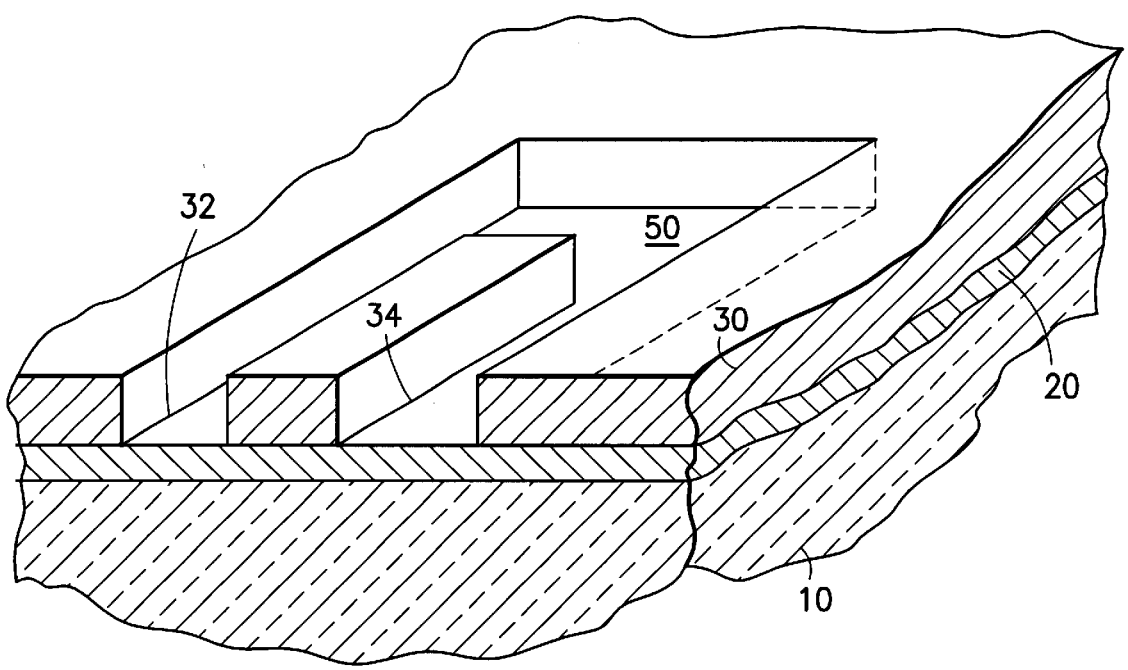
FIG. 1 shows in perspective an SOI transistor after STI etching.

Referring to FIG. 1, there is shown in perspective a device layer 30 above BOX 20 that is, in turn, above substrate 10, with shallow trench 50 having been etched to isolate a slab of the device layer that will contain a transistor. Top layer 60 (conventional pad oxide pad nitride) protects the silicon during this operation. Formation of this protective layer, threshold implants and the like will be referred to as "preparing the substrate" for simplicity in the claims. Lines denoted with numerals 32 and 34 show the corners where the trench sidewall meets the trench bottom.

Figure 2:
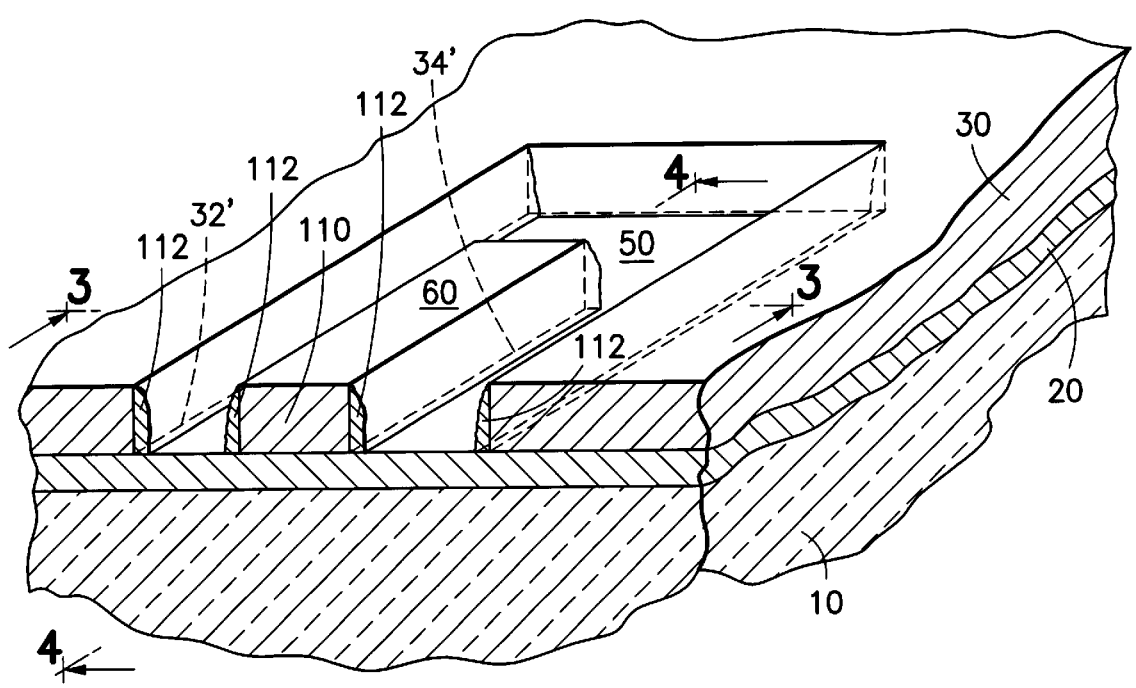
FIG. 2 shows the same area after a nitriding step according to the invention.

FIG. 2 shows the same area after the next step of growing a nitridized oxide layer 112 in the vertical trench walls. Lines 32 and 34 have now become 32' and 34' as the previous corners have been covered by the nitridized oxide layer 112. Illustratively, the layer of nitridized oxide is grown in an NO or $N_2O$ ambient at high temperature such as 1000° C. to 1100° C. At the silicon-oxide interface, there will be a high concentration of nitrogen atoms, so that diffusion blocking takes place even with very thin films. A nitride content in the range of about 5% to 15% of the total oxide has been found to be effective.

An additional benefit of the invention is that the nitride reduces interface states at the silicon-oxide interface in the transistor body significantly compared with a conventional process of growing a thin layer of thermal oxide. These interface states also can contribute to a shift in $V_t$.

Yet another benefit of this process is that the nitridized oxide is resistant to hot phosphoric acid, which is conventionally used to strip nitride films in STI processing, so that the use of this invention does not interfere with other processing steps.

When the nitridized-oxide layer is greater in thickness than about 20 nm, nitrogen will diffuse underneath the silicon slab 110 and form a layer of nitridized oxide at the bottom silicon-oxide interface between silicon 110 and BOX 20. For smaller geometries, the bottom interface will be affected with a film of less than 20 nm, since the distance over which the nitrogen must diffuse is smaller. This results in encapsulation of the silicon body and provides further resistance to dopant diffusion. The invention is not confined to SOI, however, and may be used in bulk silicon circuits as well.

Figure 3:
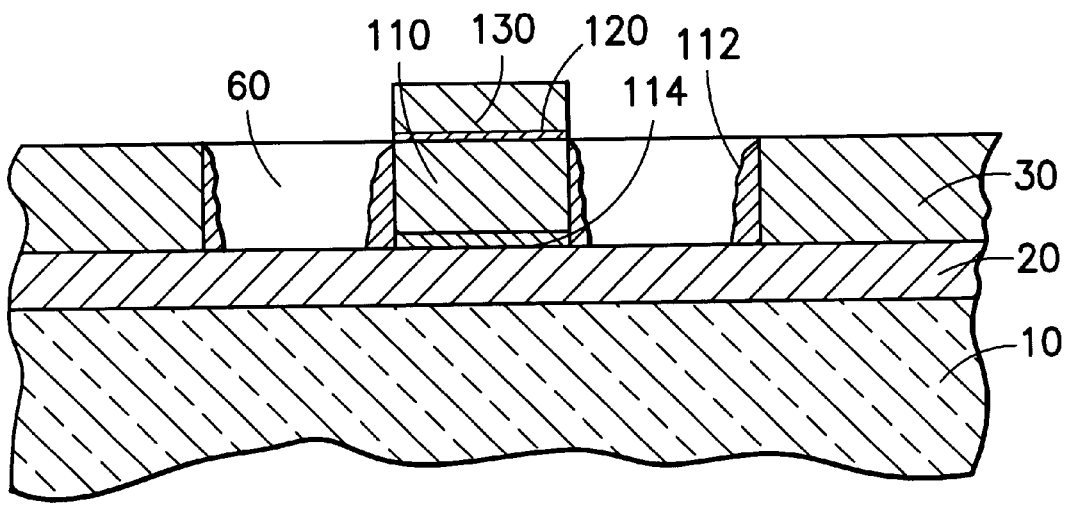
FIG. 3 shows a cross section of a transistor along line A—A in FIG. 2.

Referring now to FIG. 3, there is shown in cross section the transistor after the addition of gate oxide 120 and gate 130. This view is along the main axis of the transistor, the direction denoted by A—A in FIG. 2, with the source and drain in front of and behind the plane of the cross section. Body 110 has nitridized oxide 112 on either side and a layer of nitridized oxide 114 on the bottom. The trench is filled with oxide 60, which is deposited and planarized before the formation of the gate.

Figure 4:
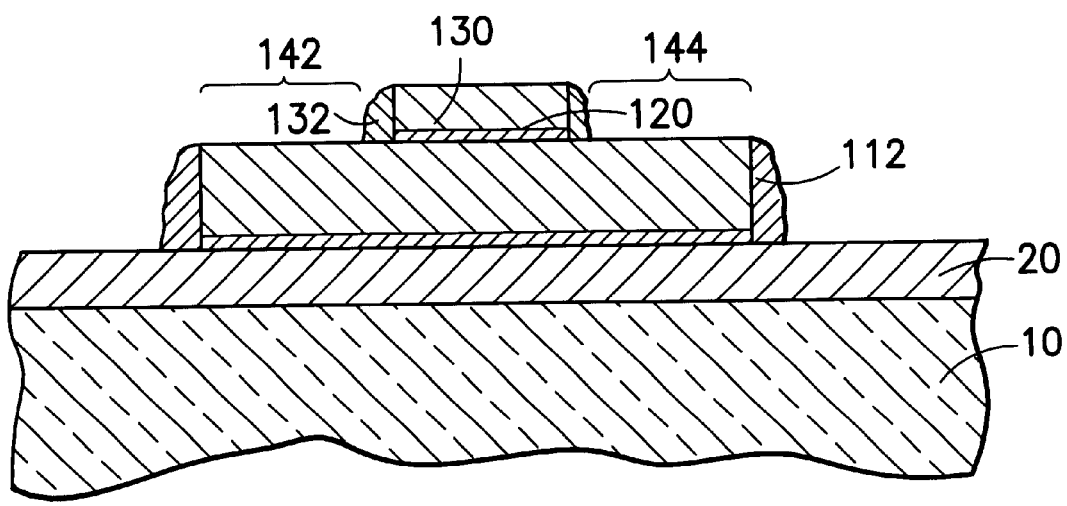
FIG. 4 shows a cross section along line B—B in FIG. 2.

Referring now to FIG. 4, there is shown another cross section along lines B—B in FIG. 2, showing source and drain 142, 144 and conventional gate sidewalls 132 on gate 130.

While the invention has been described in terms of a single preferred embodiment, those skilled in the art will recognize that the invention can be practiced in various versions within the spirit and scope of the following claims.

I claim:

1. A method of forming an integrated circuit comprising the steps of preparing a silicon on insulator substrate;

etching a set of isolation trenches in a top surface of said substrate, said set of isolation trenches defining a set of transistor active areas and having vertical trench sidewalls;

growing a layer of nitridized oxide on said vertical trench sidewalls at a temperature greater than about 1,000° C. in an ambient containing one of NO and N2O;

filling said set of isolation trenches with a dielectric and forming a set of transistors in said set of transistor active areas, and connecting said set of transistors to from said integrated circuit;

in which said step of growing said layer of nitridized oxide comprises growing said layer to a thickness greater than about 20 nm, whereby nitrogen diffuses under said set of active areas to form a layer of nitridized oxide under said set of active areas.

2. A method according to claim 1, in which said nitridized oxide contains a nitride content in the range of about 5% to 15%.

* * * * *